United States Patent
Moyal et al.

(10) Patent No.: US 7,109,763 B1
(45) Date of Patent: Sep. 19, 2006

(54) PHASE LOCKED LOOP OPERABLE OVER A WIDE FREQUENCY RANGE

(75) Inventors: Nathan Moyal, West Linn, OR (US); Eric Mitchell, Lake Oswego, OR (US); Mark Gehring, Portland, OR (US)

(73) Assignee: Cypress Semiconductor, Corp., San Jose, CA (US)

( * ) Notice: Subject to any disclaimer, the term of this patent is extended or adjusted under 35 U.S.C. 154(b) by 83 days.

(21) Appl. No.: 10/796,873

(22) Filed: Mar. 8, 2004

Related U.S. Application Data (60) Provisional application No. 60/458,085, filed on Mar. 26, 2003.

(51) Int. Cl.
  *H03L 7/00* (2006.01)
(52) U.S. Cl. .......................................... 327/156; 331/2
(58) Field of Classification Search ........ 327/147–150, 327/156–159; 375/376; 331/16, 15, 17, 331/14, 2, 179, DIG. 2
See application file for complete search history.

(56) References Cited

U.S. PATENT DOCUMENTS

| | | | | |
|---|---|---|---|---|
| 5,389,898 A | * | 2/1995 | Taketoshi et al. | 331/2 |
| 5,648,744 A | * | 7/1997 | Prakash et al. | 331/11 |
| 5,686,864 A | * | 11/1997 | Martin et al. | 331/1 A |
| 5,777,520 A | * | 7/1998 | Kawakami | 331/1 R |
| 2002/0135428 A1 | * | 9/2002 | Gomez | 331/17 |

OTHER PUBLICATIONS

Roland Best, *Phase-Locked Loops*, ISBN: 0071412018, Jun. 20, 2003.

* cited by examiner

*Primary Examiner*—Minh Nguyen
(74) *Attorney, Agent, or Firm*—Marger Johnson & McCollom

(57) ABSTRACT

A Phase Locked Loop (PLL) that has a substantially constant gain over a wide frequency range. The frequency range over which the PLL operates is divided into a number of frequency sub-ranges. The circuit includes a mechanism for adjusting the loop gain profile as the PLL moves from one frequency sub-range to another. When the PLL switches to a new frequency sub-range, the loop gain profile is adjusted to a pre-established value. Changes of frequency within each sub-range are then accomplished with the loop gain varying within a pre-established range.

20 Claims, 6 Drawing Sheets

Figure 1

Prior Art

PHASE LOCKED LOOP OPERABLE OVER A WIDE FREQUENCY RANGE

RELATED APPLICATION

This application is a non-provisional application of provisional application Ser. No. 60/458,085 filed Mar. 26, 2003. Priority of application 60/458,085 is hereby claimed.

FIELD OF THE INVENTION

The present invention relates to electronic circuits and more particularly to electronic phase locked loops.

BACKGROUND OF THE INVENTION

Phase-locked loops (PLLs) are feedback control systems that are often an essential part of many telecommunications devices. PLLs are used in modulators and demodulators, in frequency synthesizers, in clock synchronizations circuits and in many other high-speed communication applications. PLL can be implemented using digital or analog devices.

Figure 1:
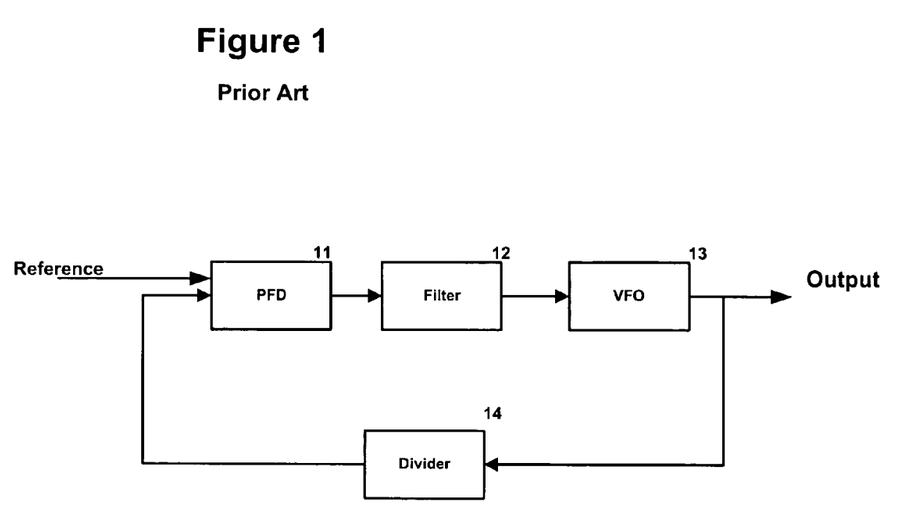
FIG. 1 is a block diagram of a prior art Phase Locked Loop.

FIG. 1 shows a block diagram of a conventional PLL. The PLL shown in FIG. 1 includes four main components, namely, a Phase Frequency Detector (PFD) 11, a Filter 12, a Variable Frequency Oscillator (VFO) 13 and feedback loop with a frequency divider 14. The VFO 13 could for example be a Voltage Controlled Oscillator (VCO).

The PFD 11 compares the phase and frequency of the feedback signal to the reference signal and it generates an error signal indicating any difference it detects. The error signal generated by PFD 11 passes through the filter 12 and is used to adjust the frequency of the VFO 13. Any differences between the input signal and the feedback signal are thus used to change the frequency of the VFO.

A PLL can be used as a frequency multiplier. For example, in the circuit shown in FIG. 1, the output of the reference signal may be a 10 Mhz signal. The output of the VCO may for example be a 1 Ghz signal. In such a PLL the frequency divider 14 would divide the 1 Ghz output signal down to a 10 Mhz signal. The frequency divider 14 can be adjusted to a higher or lower divisor in order to change the output frequency of the PLL.

There is great deal of published literature which describes the design and operation of prior art PLLs. For example, PLL technology is described in a text book entitled "Phase-Locked Loops" by Roland Best, ISBN: 0071412018, dated Jun. 20, 2003. Other books and literature which describe the principles and applications of PLL are also available.

An important parameter which affects the operation of a PLL is the loop "gain". An important component of loop gain is the gain of the VFO. Gain of a VFO is a measure of the change in the output of the VFO relative to changes in the input signal to the VFO. Where the VFO is a Voltage Controlled Oscillator (a VCO), the gain of the VCO (or of the PLL) is often expressed as mega-hertz per volt (MHz/V). Generally, for a particular PLL, it is desirable to have a constant loop gain over the entire range of frequencies at which the PLL operates. If the loop gain differs at different frequencies, the lock time, the bandwidth, and other parameters of the PLL may change when the operating frequency changes and this may adversely affect the PLL.

In some applications, a PLL must be able to operate over a wide frequency range. In many such applications it is desirable to have a loop gain that does not significantly change as the operating frequency changes even though the frequency changes cover a wide range. The present invention is designed to provide an improved PLL which has substantially constant loop gain over a wide frequency range.

SUMMARY OF THE INVENTION

With the present invention the frequency range over which the PLL operates is divided into a number of frequency sub-ranges. A mechanism is provided for adjusting the loop gain profile as the PLL moves from one frequency sub-range to another. When the PLL switches to a new frequency sub-range, the loop gain profile is adjusted to a pre-established value. Changes in frequency within each sub-range are then accomplished with the loop operating within a specified range of gain. In one preferred embodiment, the VFO is a VCO and the loop gain profile is adjusted by adjusting the gain profile of the VCO.

DESCRIPTION OF EMBODIMENTS

Figure 2:
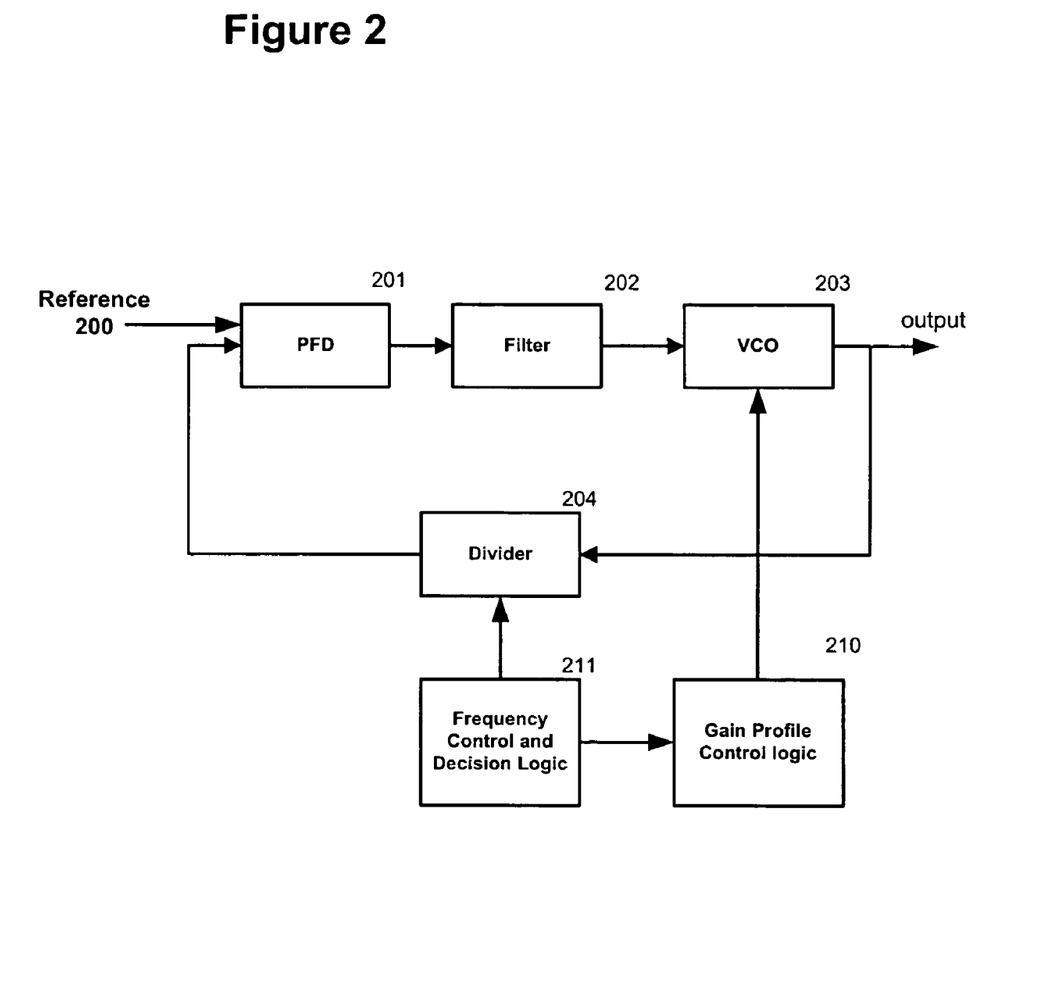
FIG. 2 is a block diagram of first embodiment of the invention.

A block diagram of a first preferred embodiment of the invention is shown in FIG. 2. This embodiment includes a reference signal 200, a Phase Frequency Detector (PFD) 201, a filter 202, a Voltage Controlled Oscillator (VCO) 203, a feedback loop that includes a frequency divider 204 and control logic 210 and 211. A VCO is a type of Variable Frequency Oscillator (VFO). The frequency of the VCO 203 is controlled by the output signal from filter 202. Additional detail concerning VCO 203 are given below with reference to FIG. 3 and the operations performed by logic 210 and 211 are described below with reference to FIGS. 5A and 5B. The PFD 201 and the filter 202 can be state of the art components.

The PLL shown in FIG. 2 is a feedback control system that automatically adjusts the phase and frequency of the signal generated by VCO 203 (after it is divided by divider 204) to match the phase and frequency of reference signal 200. When in a locked condition, any slight difference between the reference signal 200 and the VCO output (as divided by divider 204) appears as a phase difference. This phase difference causes PFD 201 to generate an error signal. The error signal is first is smoothed by filter 202 and it then acts to change the frequency of VCO 203. Stated differently, the PFD 201 generates a signal that adjusts the control voltage presented to the VCO 203 until the feedback frequency matches that of the reference signal. When the system is phase-locked, the frequency of the output of VCO 203 is N times that of the frequency of reference signal 200. (where N is the division performed by divider 204). Changing the value of the divider 204 will cause the PFD 201 to sense a frequency or phase error. The PFD 201 will then generate an error signal which will change the frequency of VCO 203.

The PLL shown in FIG. 2 is a nonlinear device because the phase detector 201 is of necessity non-linear(as is the case with most PLLs). However, when the loop is in a locked condition, the PLL can be approximated by a linear model. In this case, each of the PLLs components can be described by linear transfer function and various types of gain can be defined. For example one can define, the forward gain, the open loop gain and the closed loop gain. In general, the closed-loop gain is equal to the forward gain divided by (1+the open loop gain). The definition of gain must take into account both phase and frequency. The open loop gain, the forward gain, and the closed loop gain are all related. Thus changing either the forward gain, the open loop gain or the closed loop gain is a change in the other gains. The values of the specific elements which form the loop must be chosen so as to satisfy the normal stability requirements. The filter 202 can be a first, second, third, etc order filter as the requirements of a particular application may require.

The various gain parameters which define the PLL are determined by the characteristics of all of the components in the in the loop. That is, for example, the loop gain of the PLL shown in FIG. 2 is determined by combined the characteristics of PFD 201, filter 202, VCO 203, and frequency divider 204. However, the gain provided by the VCO is a major factor in a PLL's loop gain.

The forward gain, the open loop gain and the closed loop gain of the PLL shown in FIG. 2 is a function of the frequency at which the PLL is operating. That is, gain changes as a function of frequency. Herein the term "gain profile" is used to describe the way in which the gain of the PLL changes relative to frequency. The gain and the gain profile of a PLL Techniques can be experimentally and analytically determining.

Changes in a variety of the components in a PLL can change the gain profile of the PLL. In the specific embodiment described herein, the gain profile of the loop is changed by changing the value of certain components in the VCO 203. It should be understood that in other embodiments, the gain profile of the loop can be changed by changing components in other units that form part of the PLL loop.

The gain of a VCO is often expressed as mega-hertz per volt (MHz/V).

Figure 3:
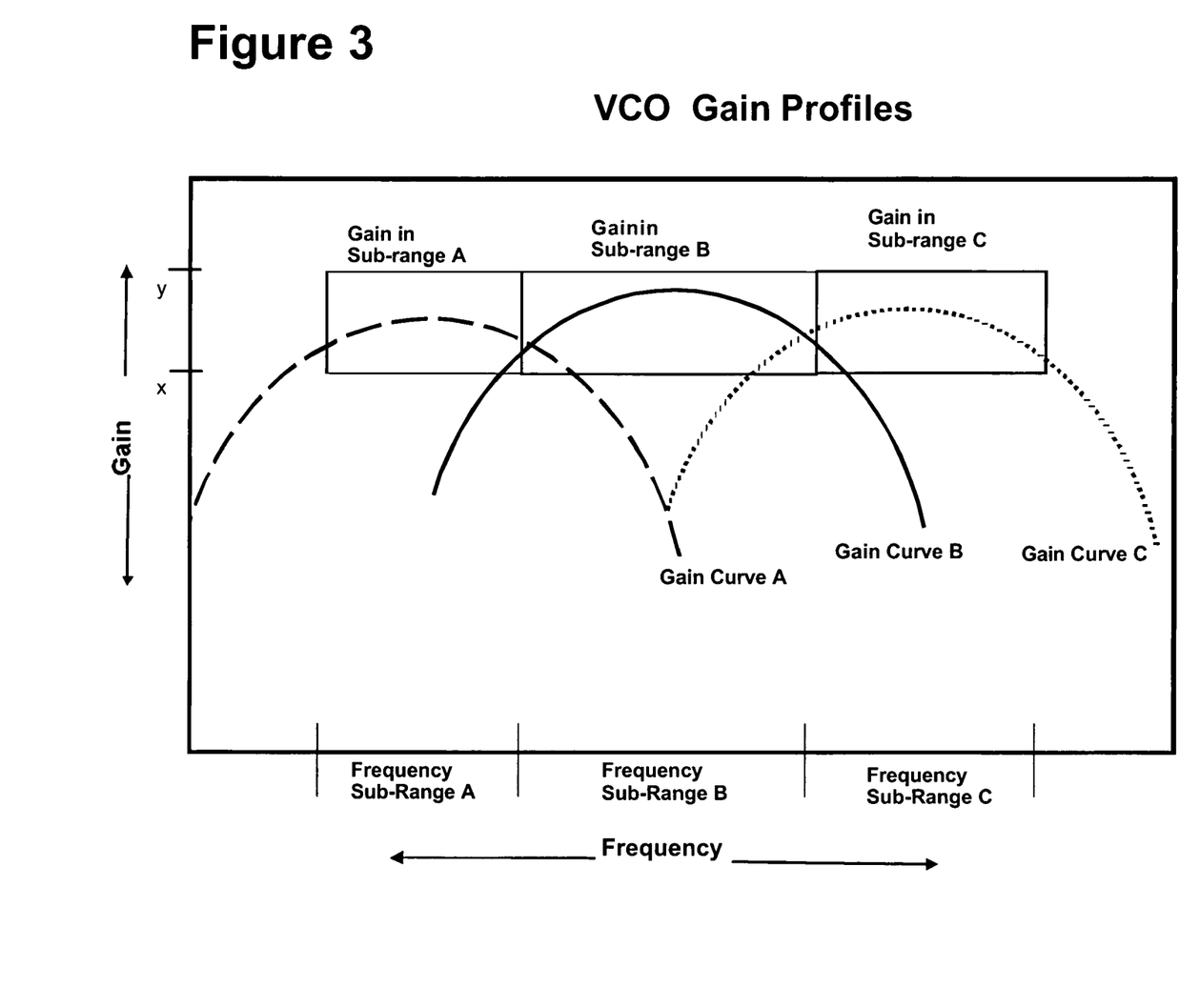
FIG. 3 is a diagram showing VCO gain at various settings.

The gain of VCO 203 is a measure of the change in the output of the VCO relative to changes in the input signal from the filter 202. The gain profile of a VCO defines how gain varies as frequency changes. FIG. 3 shows the gain of the VCO 203 plotted against the frequency. Three gain profiles, termed "Gain Curve A", "Gain Curve B, and "Gain Curve C" are shown in FIG. 3. The particular shape of the gain profile for VCO 203 depends upon the value of the components in the VCO. As will be explained in detail later, with the present embodiment, the value of certain components in the VCO 203 can be changed. Thus, the three gain profiles shown in FIG. 3 represent the operation of VCO 203 when certain components in the VCO are set to three different values.

With the present embodiment of the invention, the gain profile of the VCO 203 can be changed by an external signal. That is, the value of certain components in VCO 203 can be controlled by an external signal. As will be explained with reference to FIG. 3, the gain profile of VCO 203 is controlled by signals from gain profile control logic 210.

FIG. 3 shows three different gain curves that represent the gain of VCO 203 at three different settings provided by gain profile control logic 210. Each gain curve illustrates a different gain profile for the VCO 203.

As illustrated in FIG. 3, at each gain profile setting, the gain varies over the frequency range. In this particular preferred embodiment, the operating frequency range is divided into three different frequency sub-ranges designated frequency sub-ranges A, B and C. Naturally, the number of frequency sub-ranges selected is an engineering choice for each particular application. At each gain profile setting, the VCO gain varies over frequency as indicated by gain curves A, B and C. With the particular embodiment shown here, in order to satisfy the other requirements of the system, it is desirable to maintain the VCO gain between the values indicated as x and y in FIG. 3. The particular values established as acceptable gain are a matter of engineering choice for each particular application of the PLL.

For example in one particular embodiment the curves shown in FIG. 3 have the following values:
frequency sub-range A: between 2.4 and 2.43 GHz,
frequency sub-range B between 2.43 and 2.45 GHz
frequency sub range C between 2.45 and 2.48 GHz.
acceptable gain low value x: 0.26 GHz/V
acceptable gain high value y: 0.325 GHz/V.

The gain profile of the VCO 203 can be controlled by a signal from the Gain Profile Control Logic 210. The details of how the Gain Profile Control Logic 210 controls the gain profile of VCO 203 is described later with respect to FIG. 4.

With the present invention the gain is maintained between the x and y values across the entire frequency range of operation by changing the gain profile of the VCO 203 so that the VCO 203 operates on gain curve A in frequency sub-range A, on gain curve B in frequency sub-range B, and on gain curve C in frequency sub-range C.

It is noted that considering the overall system operation, (that is, the combination of sub-range A, sub-range B and sub-range C) the gain is relatively symmetrical about the center frequency of the entire range. As used herein the term center frequency refers to the center frequency of the entire range of frequencies at the output of the VCO.

Figure 4:
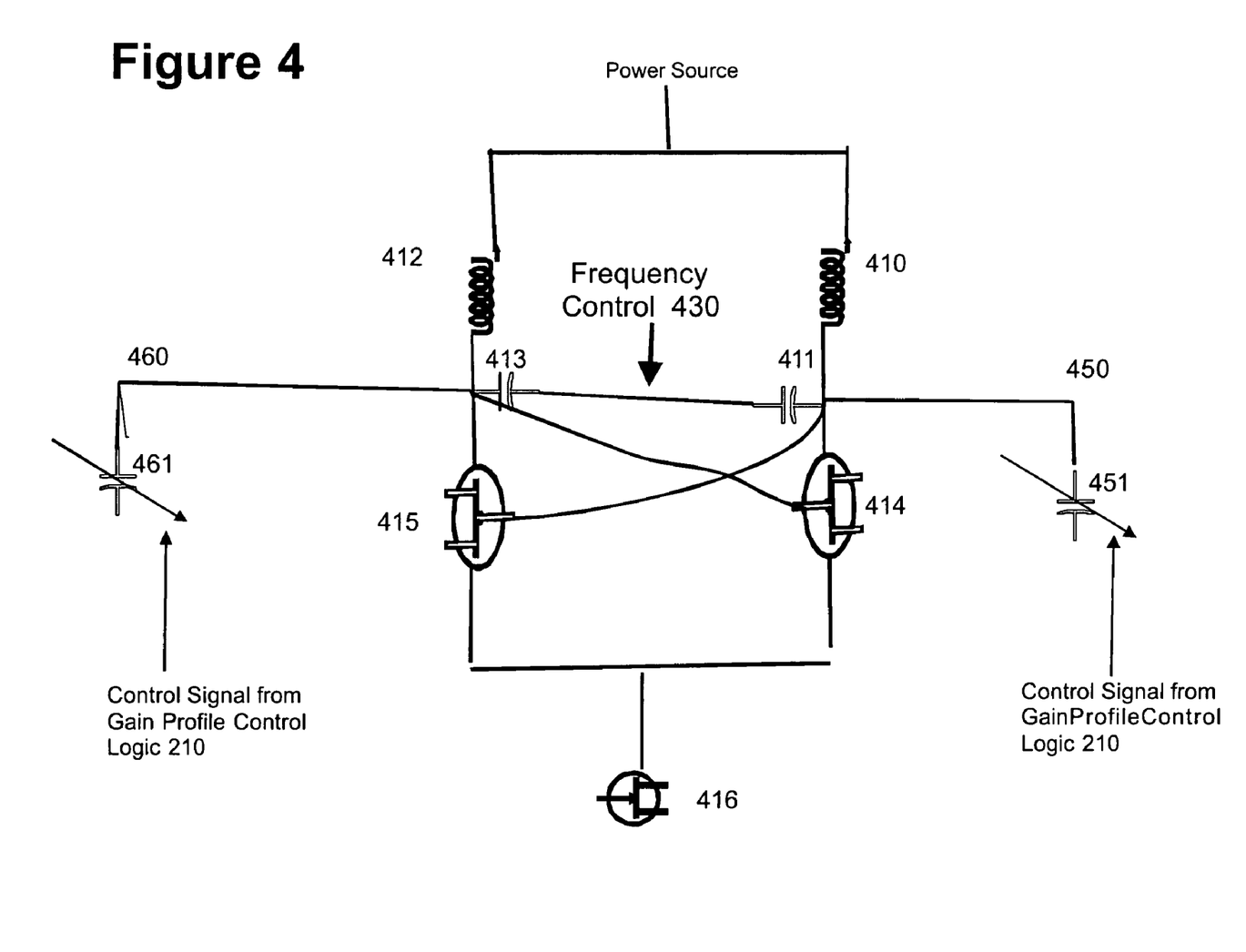
FIG. 4 is a circuit diagram of a VCO with variable gain.

FIG. 4 is a circuit diagram of VCO 203. VCO 203 one specific type of VFO. The difference between VCO 203 shown in FIG. 4 and a normal VCO, is that the gain profile of the VCO shown in FIG. 4 can be changed by an external signal. The VCO shown in FIG. 4 includes a bi-stable circuit, one side of which has a coil 410, a capacitor 411 and a transistor switch 414 and the other side of which has a coil 412, a capacitor 413 and a transistor 415. The circuit has a bias control transistor 416. The frequency of the circuit is controlled by a control signal applied at frequency control point 430. Such a bi-stable circuit is can be designed and implemented using state of the art technology.

The circuit shown in FIG. 4 also has gain profile control circuits 450 and 460. It is circuits 450 and 460 that differentiate the VCO shown in FIG. 4 from other VCO circuits. Circuits 450 and 460 are identical and they are operated in a synchronized fashion, hence, only circuit 450 will be explained in detail. Circuit 450 has a variable capacitor 451. A signal from the Gain Profile Logic 210 (shown in FIG. 3) controls the value of capacitor 451. Changing the value of capacitors 451 and 461 changes the gain profile of the VCO. That is, changing the value of capacitors 451 and 461 changes the shape and position of the curve which shows how gain changes with frequency. There are various ways of changing the values of capacitors such as capacitors 451 and 461 and the particular manner that the capacitance values are changed is not significant to the embodiment. The signals from Gain Profile Control 210 could be analog or digital control signals which change the value of capacitors 451 and 461.

The specific values of the coils, capacitors and other elements of the circuit shown in FIG. 4 are not relevant to the present invention. The present invention is directed to the overall system configuration and not to the details of the VCO. The VCO shown in FIG. 4 is merely a specific example of a VCO the gain profile of which can be controlled. There are numerous other ways that the gain profile of a VCO could be controlled. The embodiment shown merely requires a VCO, the gain profile of which can be controlled. As explained below, other embodiments of the invention utilize other types of Variable Frequency Oscillators (VFOs) the gain profile of which can be controlled by an external signal.

Figure 5A:
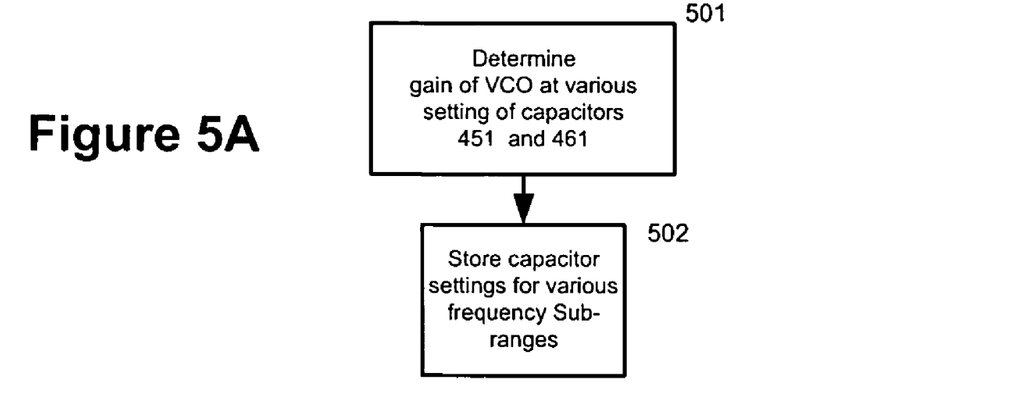
FIGS. 5A and 5B are block diagrams illustrating the operation of the system.
Figure 5B:
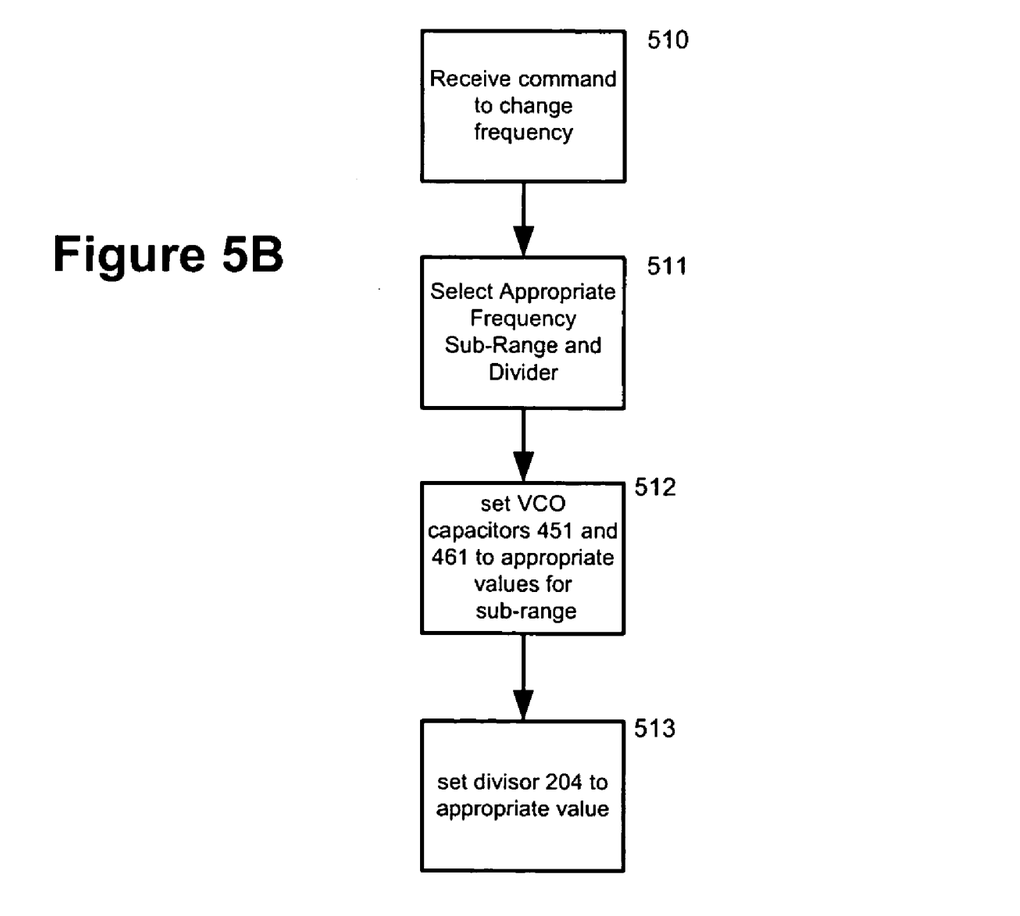

The overall operation of the system shown in FIG. 2 is shown by the block diagrams given in FIGS. 5A and 5B. FIG. 5A shows how the appropriate values for capacitor 451 and 461 are determined for the various frequency sub-ranges. As indicated by block 501, the frequency response of the VCO is measured at various settings of capacitor 451 and 461. This in effect generates a series of curves such as those shown in FIG. 3. For each desired frequency sub-range, the value of the capacitors 451 and 461 which produces a gain curve with values within the desired boundaries is determined and stored as indicated by block 502. It is noted that the gain can also be determined by various other analytical techniques. Various methods and techniques can be used to determine the gain of a VCO.

The logical operations performed by Gain Profile Control Logic 210 and Frequency Control and Decision Logic 211 and the normal operation of the system is illustrated in FIG. 5B. The operations illustrated in FIG. 5B occur after the values determined by the process illustrated in FIG. 5A have been stored in Gain Profile Control Logic 210. The process begins at block 510 when the system receives a command to set the output of the system to a new frequency value. As indicated by block 511, the sub-range into which the new frequency falls is determined. The appropriate value for divider 204 is determined in a normal manner. The appropriate value for capacitors 451 and 461 for this particular sub-range are then retrieved from where they were stored as indicated by block 512. The capacitors are then set to this new value and the divider 204 is set to the appropriate value. Alternatively, the sequence can be reversed, that is, the divider can be first adjusted and then the capacitors can be reset. In still another alternative embodiment, both changes can be made simultaneously. The above operations are performed by Gain Profile and Control Logic 210 and Frequency Control and Decision Logic 211. Such logic is can be performed by a set of discrete logical components or it can be performed by a programmed microprocessor. The division of the logic into two units 210 and 211 is solely for the purpose of ease of explanation and all the logic could be in one unit.

Various other embodiments of the invention are possible. For example alternate embodiments of the invention can use other types of Variable Frequency Oscillators (VFOs), the gain profile of which can be varied by an external signal. One alternate embodiment utilizes a VFO, the frequency of which is controlled by a current signal instead of by a voltage signal.

The oscillator shown in FIGS. 2 and 4 is a VFO the frequency of which is controlled by voltage signal 430 and the gain profile of which is controlled by an external signal from logic 210. Alternate embodiments of the invention can include a VFO, the frequency of which can be controlled by a current signal (or by a digital signal) and the gain profile of which can be controlled by an external signal. Various components can be changed by an external signal so as to change the gain profile of the VFO. Variable Frequency Oscillators the frequency of which is controlled by a voltage signal, a current signals, or a digital signals can be used in various embodiment of the invention.

The term variable frequency oscillator (VFO) is meant to include oscillators, the frequency of which can be controlled by a voltage signal, a current signal or by a digital signal. With respect to FIG. 4, in alternate embodiments, the control signal 430 could be a current signal or a digital signal. To implement the present invention, what is needed is a VFO, the gain profile of which can be controlled by an external signal. That is, one of its parameters must be controllable by an external signal so that its gain profile can be controlled. Alternate embodiments of the invention use other types of VFOs, the gain profile of which can be varied by an external signal. The VCO shown in FIG. 4 is merely meant as an example of a VFO the gain profile of which can be controlled by an external signal.

Figure 6:
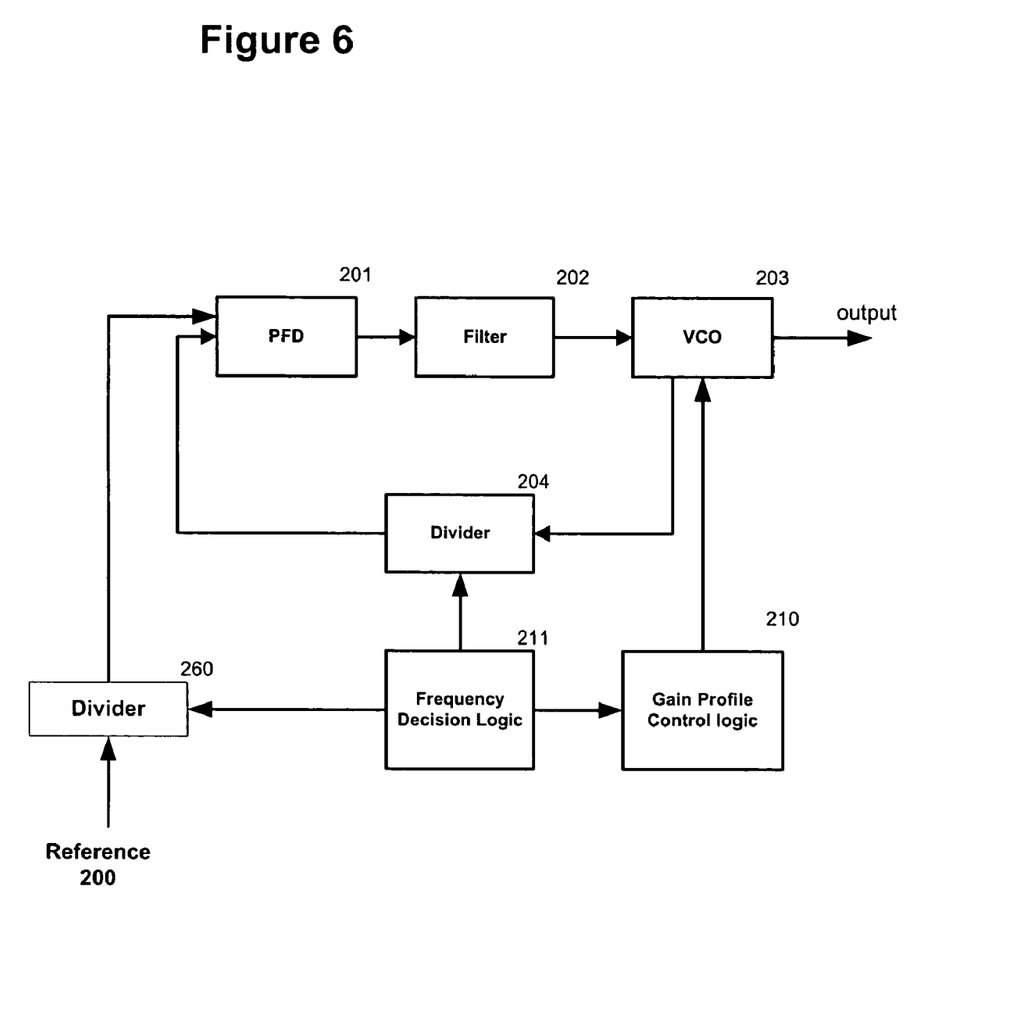
FIG. 6 is a block diagram of an alternate embodiment of the invention.

FIG. 6 shows still another alternate embodiment of the invention. The difference between the embodiment shown in FIG. 2 and the embodiment shown in FIG. 6, is that in the embodiment shown in FIG. 6, the reference signal 200, goes through a frequency divider 260, before the signal goes to the PFD 202. This gives the system a wider frequency range. In the embodiment shown in FIG. 6, the control logic 211 not only controls the division 204 and the gain control 210, but it also controls divider 260 which divides reference signal 200. Whether or not divider 260 is necessary to obtain the desired frequency range is a matter of engineering design. Use of such a frequency divider for the reference signal can increase the frequency range of the system.

In still another alternative embodiment (not shown in the Figures), control 211 merely controls divider 260 and gain control 210. In such an embodiment, the control of divider 204 could be by an entirely independent control, or divider 204 could be set at a fixed divisor.

The systems shown in FIGS. 2 and 6 could be built on a single integrated circuit chip. Alternatively, various components can be located on different chips. How the components are assigned to specific chips is a matter of engineering design. The system can be implemented as an analog (i.e. linear) circuit or as a digital circuit. Alternatively the system can be implemented as a hybrid circuit with some analog and some digital components. The logic circuits 210 and 211 can be implemented as special purpose logic or they could be implemented using microprocessor control logic. In still another alternative embodiment, the entire system could be implemented using a programmed computer and a computer program which simulates the various components in the system.

It is noted that the particular filter chosen for a particular PLL depends upon the specific application of the PLL. For example, filter 202 could be a charge pump. The order of filter 202 is not relevant to the present invention and it is a matter of engineering design. The PFD 201 and the filter 202 can be designed and implemented as required by the particular applications for which a particular embodiment is designed.

It is noted that the system could be implemented as an integer N frequency synthesizer which creates a set of frequencies that are an integer multiple of a fixed reference frequency. Alternatively, the system could be implemented as a fractional N frequency synthesizer which produces frequencies that are an Nf (N times F) multiple of a fixed reference (where N is an integer and f is a fractional part of an arbitrary number. Such embodiments involve various relationships between the divider 204 and any divider of reference signal 200.

In the preferred embodiment shown in detail herein the loop gain profile is varied by varying the gain profile of the VFO. In still other alternate embodiments, the loop gain of the PLL is varied by changing components in elements of the PLL other than the VFO.

While the invention has been shown and described with respect to a number of embodiments thereof, it should be understood that various other changes in form and detail may be made without departing from the sprit and scope of the invention.

We claim:

1. A phase locked loop (PLL) system including
a phase frequency detector (PFD),
a filter, a variable frequency oscillator (VFO), and
a feedback loop including a frequency divider that has several divider values, said PLL operating over a frequency range that includes a number of frequency sub-ranges, the center frequency of each sub-range being determined by one of said divider values,
said VFO having a variable gain profile, the gain profile of said VFO being controlled by gain control logic which sets the gain profile of said VFO so that the gain of the VFO remains within a desired range as the operation of said PLL moves between said frequency sub-ranges.

2. The system recited in claim 1 wherein said frequency range is from 2.4 GHz to 2.48 GHz.

3. The system of claim 1 wherein said desired range of gain is from 0.26 GHz per volt to 0.325 GHz per volt.

4. The system in claim 1 wherein said frequency range is divided into three sub-ranges.

5. The system of claim 1 wherein said pre-established limits of gain is from 0.26 GHz per volt to 0.325 GHz per volt.

6. A method of operating a phase locked loop (PLL) which operates over a frequency range that includes a number of frequency sub-ranges, said sub-ranges being established by the value of a frequency divider in a feedback loop,
said PLL including a variable frequency oscillator (VFO) the gain profile of which is variable in response to changing the value of selected components of said VFO,
said method including,
determining the particular setting of said selected components for each frequency sub-range that produces a selected gain profile that is within pre-established limits for each of said frequency sub-ranges, and
changing the settings of said selected components to the particular settings for each frequency sub-range when said PLL is set to operate within a particular sub-range.

7. The method in recited in claim 6 wherein said frequency range is from 2.4 GHz to 2.48 GHz.

8. The method of claim 6 wherein said pre-established limits are from 0.26 GHz per volt to 0.325 GHz per volt.

9. The method of claim 6 wherein said frequency range is divided into three sub-ranges.

10. A phase locked loop(PLL) system including
a phase frequency detector (PFD),
a filter, a variable frequency oscillator (VFO),
and a feedback loop including a frequency divider having a plurality of divide values,
said PLL operating over a frequency range that includes a plurality of frequency sub-ranges, each range being established by a divider value of said divider,
said VFO having variable gain profile, said variable gain profile having one value for each particular frequency sub-range which maintains the gain of said VFO within pre-established limits within said particular frequency sub-range, and
a logic circuit operable when the frequency of operation of said PLL changes frequency sub-range to change the gain profile of said VFO to a value which maintains said gain within pre-established limits over said frequency sub-range.

11. A phase locked loop(PLL) including
a phase frequency detector (PFD),
a filter, a voltage controlled oscillator (VCO), and
a feedback loop including a frequency divider, said frequency divider having a plurality of divider values,
said PLL operating over a frequency range that includes a number of frequency sub-ranges, said VCO having a variable gain profile, and
means for changing the gain profile of said VCO when said, PLL changes operation between said frequency subranges,
whereby the gain of said VCO is within pre-established limits over each frequency sub-range.

12. A method of operating a phase locked loop (PLL) which operates over a frequency range that includes a number of frequency sub-ranges, said PLL including a voltage controlled oscillator (VCO) the gain profile of which is variable, said method including:
a feedback loop having a frequency divider, said divider having a plurality of divider values that establish different frequency sub-ranges,
changing the frequency of operation of said PLL,
determining if said PLL is operating in a different frequency sub-range when the frequency of operation changes, and
when the frequency of operation of said PLL changes frequency sub-ranges, changing the gain profile of said VCO to a profile that is within pre-established limits over said frequency sub-range.

13. A phase locked loop (PLL) system which operates over a frequency range that includes a number of frequency sub-ranges established by the division provided by a frequency divider in a feedback loop, said PLL including
a variable frequency oscillator (VFO) the gain profile of which is variable,
a first circuit for changing the frequency of operation of said PLL,
a second circuit for determining if changes to the frequency of operation of said PLL has changed the frequency sub-range in which said PLL is operating, and
a third circuit operable when the frequency of operation of said PLL changes frequency sub-ranges to change the gain profile of said VFO to a profile that has a gain within pre-established limits over said frequency sub-range.

14. The system recited in claim 13 wherein said frequency range is from 2.4 Ghz to 2.48 Ghz.

15. A phase locked loop (PLL) system recited in claim 13 wherein said third means includes gain control logic which changes the gain of said VFO when said PLL changes sub-ranges.

16. A phase locked loop (PLL) system recited in claim 13 wherein the overall gain of said system is substantially symmetrical around the center of said frequency range.

17. A method of operating a phase locked loop (PLL) which operates over a frequency range that includes a number of frequency sub-ranges, said frequency ranges being established by the value of a frequency divider in a feedback loop, said PLL including a variable frequency oscillator (VFO), said PLL having a loop gain profile which is variable, said method including,
- determining if changes to the frequency of operation of said PLL has changed the frequency sub-range in which said PLL is operating, and
- changing the loop gain profile of said PLL when the operation of said PLL changes sub-ranges, said profile being changed to a profile that has a gain within pre-established limits over said frequency sub-range.

18. A phase locked loop(PLL) system including
- a phase frequency detector (PFD),
- a filter,
- a variable frequency oscillator (VFO), and
- a feedback loop including a frequency divider, which has a plurality of divider values, thereby establishing a plurality of frequency sub-ranges,
- said PLL operating over a frequency range that includes a number of said frequency sub-ranges,
- said PLL having a variable loop gain profile,
- the loop gain profile of said PLL being controlled by gain profile control logic which sets the loop gain profile of said PLL so that the loop gain of the said PLL remains within a desired range as the operation of said PLL moves between said frequency sub-ranges.

19. The phase locked loop system recited in claim 18 wherein said loop gain profile is changed by changing the gain profile of said VFO.

20. The phase locked loop system recited in claim 18 wherein said VFO is a Voltage controlled oscillator (VCO).

* * * * *